United States Patent
Guo

(10) Patent No.: US 10,355,661 B1
(45) Date of Patent: Jul. 16, 2019

(54) ANTI-RESONANCE STRUCTURE FOR DAMPENING DIE PACKAGE RESONANCE

(71) Applicant: ATI Technologies ULC, Markham (CA)

(72) Inventor: Fei Guo, Ottawa (CA)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 0 days.

(21) Appl. No.: 16/115,301

(22) Filed: Aug. 28, 2018

(51) Int. Cl.
| | |
|---|---|
| *H05K 1/16* | (2006.01) |
| *H03H 7/38* | (2006.01) |
| *H01L 23/64* | (2006.01) |

(52) U.S. Cl.
CPC ............ *H03H 7/38* (2013.01); *H01L 23/642* (2013.01); *H01L 23/645* (2013.01); *H01L 23/647* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,061,913 A | * | 10/1991 | Okochi ................ | H03H 7/0115 333/12 |
| 8,228,680 B2 | * | 7/2012 | Myat ...................... | H01L 23/50 361/763 |
| 9,345,126 B2 | * | 5/2016 | Hoshi .................. | H05K 1/0224 |

* cited by examiner

*Primary Examiner* — An T Luu
(74) *Attorney, Agent, or Firm* — Polansky & Associates, P.L.L.C.; Paul J. Polansky; Nathan H. Calvert

(57) ABSTRACT

A power delivery network, circuit, and method reduce die package resonance of an integrated circuit (IC) die. Decoupling capacitors interact with equivalent series inductances (ESLs) of power conductors within a package carrier substrate create the die package resonance characteristic. In one form, an anti-resonance tuning circuit has a first node conductively coupled to one of the IC die's positive or negative power supply conductors, and a second node conductively coupled directly to a selected conductive structure on the carrier substrate. The anti-resonance tuning circuit includes a tuning capacitor, a tuning inductor, and optionally a dampening resistor coupled in series and having values sufficient to mitigate the die package resonance. In another form, impedance adjustment techniques are provided to connect and tune the anti-resonance tuning circuit to lower an impedance peak.

20 Claims, 6 Drawing Sheets

US 10,355,661 B1

ANTI-RESONANCE STRUCTURE FOR DAMPENING DIE PACKAGE RESONANCE

BACKGROUND

Die package resonance is a concern in the performance power delivery networks (PDNs) due to the low loss nature of PDNs. In the case of semiconductor power supplies, such resonance is a well-known issue for PDN designers. For example, in case of power supplies to processor cores, malware has been spread that can cause the power supply to oscillate. Die package resonance is due to increases in the PDN output impedance as the system operating frequency increases, which can cause the supplied voltage to drop below specification when a high current is demanded by the load. The increased output impedance is due to inductance that is inherent in the package's conductors, which connect the semiconductor to its host system, and from the capacitance of decoupling capacitors, referred to as "decaps," which are often added to the system to reduce the output impedance. The decaps lower the output impedance of the power delivery network, essentially storing and delivering energy to the semiconductor circuitry to keep the voltage at the desired level. However, the decaps do not entirely solve the problem. The decaps interact with the inductance of the package, forming a parallel LC "tank" circuit along with capacitances inherent in the semiconductor device. This circuit resonates to cause die package resonance at a resonant frequency. PDN output impedance also peaks at the resonant frequency, causing voltage to swing excessively.

There are a few existing solutions to help mitigate die package resonance. One approach is to use high quality, controlled-ESR (equivalent series resistance) capacitors on the package and the host circuit board to suppress the resonance. This solution is very costly. Another solution is adding an on-die dampening resistor in series to on-die decaps, which requires careful physical layout implementation. Often, designers also lower the impedance peak by reducing the package inductance and increasing the on-die decap capacitance, both of which have significant cost impact on product designs.

Figure 1:
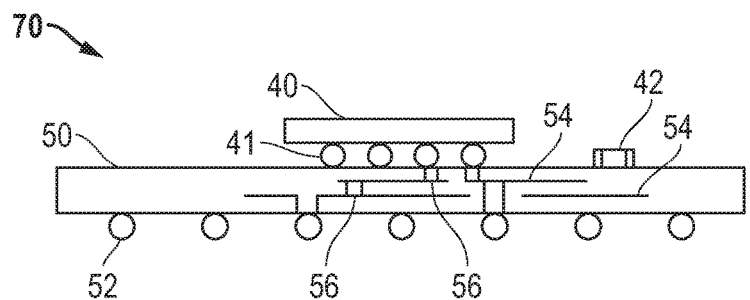
FIG. 1 illustrates in cross-section diagram form a packaged integrated circuit (IC) according to the prior art.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

In one form, an integrated circuit structure includes an IC die including positive and negative power supply conductors, a package, one or more decoupling capacitors, and an anti-resonance tuning circuit. The package includes a carrier substrate carrying the IC die, and positive and negative external power supply contacts coupled to the IC die positive and negative power supply conductors through respective positive and negative conductive structures of the carrier substrate, each of the conductive structures having an equivalent series inductance (ESL). One or more decoupling capacitors are coupled between the positive and negative power supply conductors. The decoupling capacitors and the ESLs of carrier substrate positive and negative conductive structures together exhibit a die package resonance characteristic. An anti-resonance tuning circuit has a first node coupled to one of the IC die positive or negative power supply conductors and a second node conductively coupled directly to one of the carrier substrate positive or negative conductive structures. The anti-resonance tuning circuit comprises a tuning capacitor, a tuning inductor, and a dampening resistor coupled in series and having values sufficient to reduce the die package resonance characteristic enough to prevent die package resonance characteristic from exceeding a designated specification.

In another form, a circuit is provided for reducing die package resonance of an IC die in which one or more decoupling capacitors are coupled between positive and negative power supply conductors. The decoupling capacitors, together with equivalent series inductances (ESLs) of power conductors within a carrier substrate holding the IC die, exhibit a die package resonance characteristic. An impedance adjustment circuit has a first node conductively coupled to one of an IC die positive or negative power supply conductors and a second node conductively coupled directly to a selected conductive structure on the carrier substrate. The impedance adjustment circuit comprising a series circuit having an impedance function including a zero with a center frequency at a frequency of the die package resonance characteristic. The impedance function is sufficient to reduce the die package resonance enough to prevent die package resonance from exceeding a designated specification.

In yet another form, a method of mitigating die package resonance in a packaged IC power distribution system comprises supplying power to digital circuitry on the packaged IC with positive and negative power supply conductors on the packaged IC supplied through positive and negative conductive structures in an IC package. The method further comprises operating the digital circuitry and mitigating power supply deviations to the digital circuitry with one or more decoupling capacitors. Current is fed back through a circuit branch connected between at least one of the IC package positive or negative conductive structures and at least one of the IC positive or negative power supply conductors at a resonant frequency.

FIG. 1 shows a cross-sectional diagram of example prior art packaged IC 70 which may exhibit die package resonance. An IC die 40 is mounted on a carrier substrate 50 with solder bumps or balls 41 connecting to corresponding pads on carrier substrate 50, coupling IC die 40 to circuitry of carrier substrate 50. IC die 40 is connected to external circuitry through the package's external contacts 52, which may be ball grid array contacts or other suitable contacts such as pins. Carrier substrate 50 includes metal layers 54 in which circuitry including conductive traces or planes are formed, and includes metal traces and pads formed on the carrier substrate upper surface, which may carry components such as the depicted ceramic chip capacitor 42. Package vias 56 generally are connected between the carrier substrate 50 surface, metal layers 54, and external contacts 52. A PDN for IC die 40 includes not only circuitry within IC die 40, but power and ground conductors in metal layers 54 connected to IC die, and typically includes decaps mounted to carrier substrate 50 such as the depicted ceramic chip capacitor 42.

Figure 2:
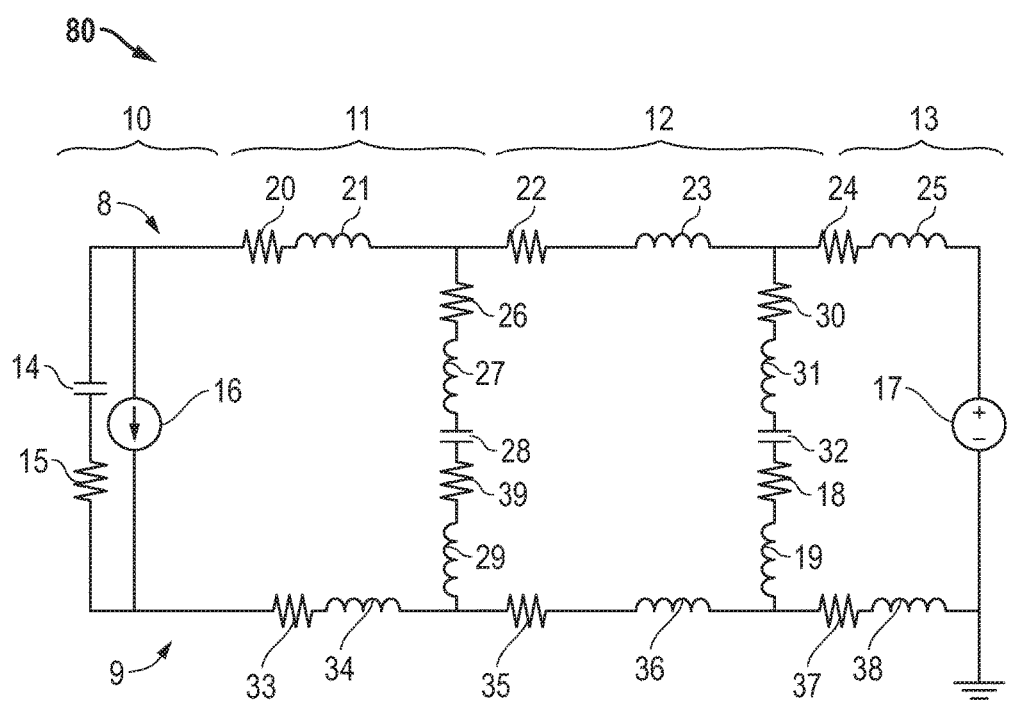
FIG. 2 illustrates in circuit diagram form an equivalent circuit of a power delivery network of a packaged IC mounted in a host system according to the prior art.

FIG. 2 shows an electrical equivalent circuit diagram for an example prior art PDN circuit model 80. The depicted PDN circuit model 80 is generally a model representing non-ideal conductors throughout the PDN, which each have an equivalent resistance and inductance. PDN circuit model 80 spans the IC die, the package, the host circuit board, and the power supply, with the positive supply conductors shown generally at 8, and the negative power supply conductors shown at 9. The bracket labelled 10 ("IC die 10") identifies the electrical equivalents for the portions of the PDN on the IC die. The bracket labelled 11 ("package circuitry 11") identifies the electrical equivalent circuitry for the package PDN conductors, and the bracket labelled 12 ("PCB circuitry 12") board identifies the electrical equivalents for a host printed circuit board PDN conductors. The bracket labelled 13 ("power supply 13") identifies the electrical equivalent circuitry for a host power supply.

Referring to IC die 10, the power load of circuitry on IC die 10 is represented with a variable current source 16 connected between positive power supply conductor 8 and negative power supply conductor 9. Capacitor 14 and resistor 15 represent the equivalent capacitance of IC die 10 and its ESR, and are connected in series between the power supply conductors 8 and 9. Package circuitry 11 includes positive and negative conductive structures in and on the carrier substrate which are connected to positive and negative power supply conductors 8 and 9, respectively. Positive conductive structures of package circuitry 11 are represented by resistor 20 and inductor 21, which represent the ESR and ESL of the various package traces, power planes, and pads that connect IC die 10 to the host system. Negative conductive structures of package circuitry 11 are similarly represented by resistor 33 and inductor 34. Capacitor 28 ("package decaps 28") represents the sum of all the package decaps of the PDN. A series circuit connects package decaps 28 between the carrier substrate positive and negative conductive structures, and includes a resistor 26, representing the ESR of the package conductors connecting package decaps 28 between the positive and negative power supply conductors, an inductor 27, representing the ESL of package conductors on the positive side of package decaps 28, a resistor 39 representing the parasitic resistance of the package decaps 28, and an inductor 29 representing the parasitic inductance of decaps 28. The total package inductance (represented by inductors 21 and 34), together with the package decaps 28 and the IC die 10 equivalent capacitance shown by capacitor 14, exhibit die package resonance causing a harmful impedance increase at a resonant frequency f generally given by Equation (1).

$$f = \frac{1}{2\pi\sqrt{LC}} \quad (1)$$

PCB circuitry 12 includes resistor 22 and inductor 23 representing the ESR and ESL of the positive power supply conductor of PCB circuitry 12, respectively, and resistor 35 and inductor 36 represent the same characteristics for the negative power supply conductors of PCB circuitry 12, respectively. These conductors may include intermediate conductors such as sockets or multi-chip module contacts. Capacitor 32 represents the board-level decaps connected between the positive and negative power supply conductors of PCB circuitry 12. Resistance 18 and inductance 19 shown connected in series with capacitor 32 represent the capacitor's parasitic resistance and inductance. Resistance 30 and inductance 31 represent the parasitic resistance and parasitic of the conductors that connect capacitor 32 between the positive and negative power supply conductors of PCB circuitry 12. Referring to the power supply 13, a voltage supply 17 represents the power supply, with resistor 24 and inductor 25 representing the ESR and ESL of the conductors connecting the supply to the circuit board on the positive side. Resistor 37 and inductor 38 represent the similar equivalents for the conductors on the negative side. Power supply 13 may supply power for multiple packaged chips in the host system, for example memory IC's on a memory DIMM or high-bandwidth memory module, or it may supply power only to the IC die 10 or to a localized power domain within IC die 10.

Figure 3:
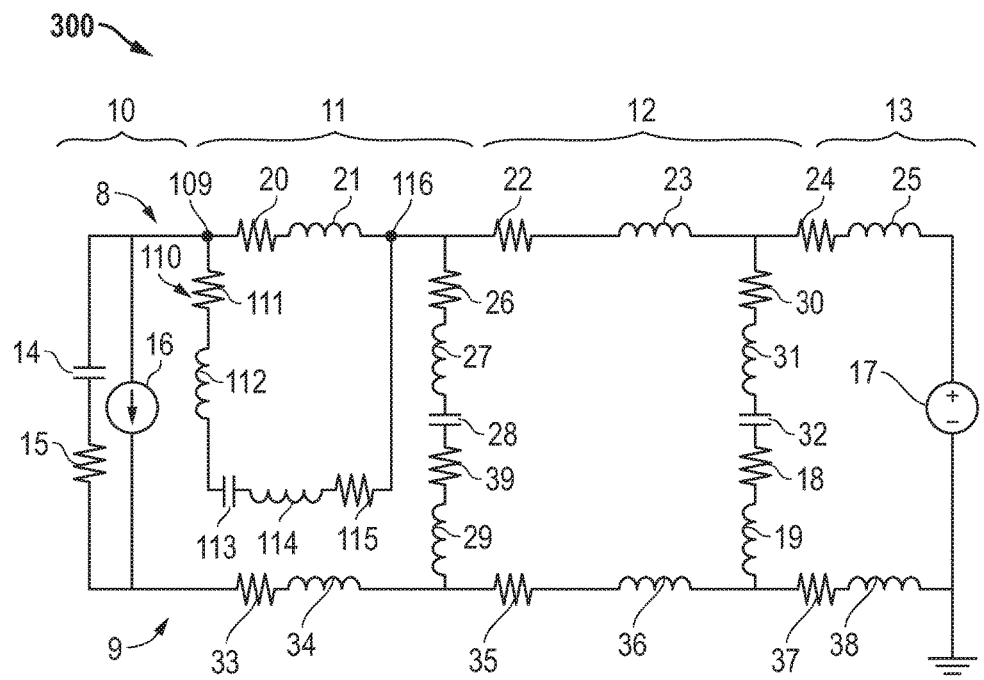
FIG. 3 illustrates in circuit diagram form a power delivery network for a packaged integrated circuit according to some embodiments.

FIG. 3 illustrates in circuit diagram form a power delivery network (PDN) 300 for a packaged IC according to some embodiments. The depicted circuit represents electrical equivalents of non-ideal physical components in PDN 300. The depicted PDN elements and their configuration follow the model developed with respect to FIG. 2, except for the addition of anti-resonance tuning circuit 110, and will not be described again in detail except where such detail is relevant. The electrical equivalent circuit for IC die 10 is shown as a variable current load 16, the equivalent resistance, represented by resistor 15, and the equivalent capacitance, represented by capacitor 14, of the IC die 10. The equivalent values are typically provided for the entire IC, or for a relevant power domain within the IC. Either may be used. IC die 10 includes positive and negative power conductors 8 and 9, connected to package circuitry 11 through respective multiple conductive structures (such as, for example, package vias, bumps, traces, wire bonds, or solder pads). The multiple conductive structures having an equivalent series inductance (ESL) represented by inductors 21 and 34, and equivalent series resistance (ESR) represented by resistors 20 and 33.

One or more decoupling capacitors, represented by package decaps 28, are connected between positive and negative power supply conductors of IC die 10. Such decoupling capacitors may include package level decap capacitors represented by capacitor 28, on-die capacitors (not separately shown) connected between the positive and negative power supply conductors, or both. While, in this version, package decaps 28 are located on the carrier substrate of package circuitry 11, in other embodiments, decaps may be provided on IC die 10. As discussed with regard to FIG. 2, the decoupling capacitors and the ESLs of the package's multiple conductive structures together exhibit a die package resonance characteristic. This die package resonance characteristic has a resonant frequency at which the output impedance of the PDN 300 has a deleterious peak in value. The die package resonance characteristic may be measured in any suitable way allowing the measurement of package resonance, such as by measuring output impedance or output voltage ripple as it varies over frequency. A desired specification to reduce the die package resonance may also be measured and specified in a similar manner, such as, for example, a specified value of reducing output impedance, or a maximum specified voltage ripple such as a plus or minus 5% or 10% variation in the supply voltage on the IC die. In this embodiment, the die package resonance characteristic is measured through the output impedance of the PDN circuit over a desired frequency range including frequencies expected to be present under operation of IC die 10.

To mitigate such die package resonance, PDN 300 includes an anti-resonance tuning circuit 110 having a first node 109 connected to the positive power supply conductors 8, and a second node 116 and connected directly to the carrier substrate positive conductive structures. The conductive connection of first node 109 to tuning capacitor 113, represented by the parasitic resistance 111 and parasitic inductance 112 of the conductive structure forming the connection, may be implemented with dedicated terminal on IC die 10, connected to a corresponding pad and trace on the package's carrier substrate, and may include a package via and some length of conductive trace in one or more of the carrier substrate layers. This connection provides a parallel feedback path through anti-resonance tuning circuit 110 to the carrier substrate positive conductive structures. Anti-resonance tuning circuit 110 includes a tuning capacitor 113, a tuning inductor 114, and a dampening resistor 115 connected in series having values sufficient to reduce the die package resonance characteristic. Tuning inductor 114 may be implemented with conductive traces in package circuitry 11 designed to have an ESL of the desired value, or may be constructed an inductor component mounted along the carrier substrate or formed on the carrier substrate. While, in this version, tuning inductor 114 is implemented in the package circuitry 11, this is not limiting and other versions may implement tuning inductor 114 on IC die 10. Similarly, tuning capacitor 113 and dampening resistor 115 is shown implemented on package circuitry 11, but may be implemented on IC die 10. Anti-resonance tuning circuit 110 also includes resistance 111 and inductance 112, which represent the electrical equivalent resistance and inductance values for the conductive structure used to connect anti-resonance tuning circuit 110 from IC die 10 to package circuitry 11. For versions in which tuning capacitor 113, tuning inductor 114, and dampening resistor 115 are implemented on IC die 10, resistance 111 and inductance 112 would appear adjacent to second node 116. Such versions have the advantage that an on-chip resistor of relatively small area may be used to implement dampening resistor 115. Resistance 111 and inductance 112 would appear between other elements of anti-resonance tuning circuit 110 if some of the elements are implemented on chip while others are implemented off chip. It should be noted that the values of resistance 111 and inductance 112 should be subtracted from desired values for the entire anti-resonance tuning circuit 110 to design anti-resonance tuning circuit 110.

Figure 7:
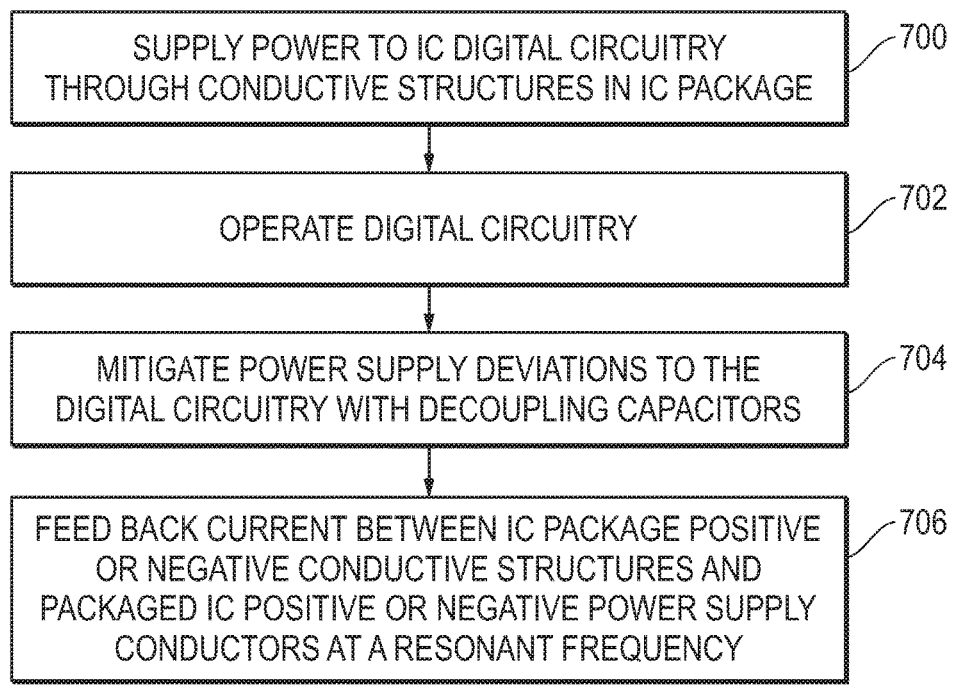
FIG. 7 illustrates a flow diagram of a process of mitigating die package resonance according to some embodiments.

In operation, anti-resonance tuning circuit 110 works to mitigate die-package resonance according to the process in the flow chart of FIG. 7. Referring to FIG. 7, while the process is shown in ordered blocks, generally the various electrical circuits function simultaneously as the IC operates, and the order is not limiting in any way. At block 700, IC die 10's digital circuitry is supplied with power through the various conductive structure of the package. At block 702, the IC die 10's digital circuitry operates, switching to perform digital logic functions in a manner that draws variable current from the PDN. Such current variations are often complex, including many different frequencies and spikes in current that tend to cause deviations the power supply voltage on IC die 10. At block 704, the PDN's decoupling capacitors, such as package decaps 28, help to mitigate such deviations by holding charge and supplying it upon heavy demand from the digital circuitry. However, as discussed above, the decoupling capacitors cause die package resonance at a resonant frequency, resulting in deleterious voltage variations on IC die 10's power supply. At block 706, the process includes feeding back current at a resonant frequency through a circuit branch of the anti-resonance tuning circuit, connected between at least one of the IC package positive or negative conductive structures and at least one of the IC positive or negative power supply conductors to mitigate the die package resonance. Block 706 may also include feeding back the current through a dampening resistor to help mitigate additional resonance in anti-resonance tuning circuit 110. The various embodiments herein operate in a similar manner to block 706, feeding back the current through a tuning capacitor 113 and tuning inductor 114. Such feedback helps to prevent circulating currents that occur at the die package resonant frequency, which circulate through the package decaps 28 and the inductances package ESL represented by inductors 21 and 34.

Referring again to the embodiment of FIG. 3, and to the other embodiments herein, the various embodiments of anti-resonance tuning circuit 110 perform impedance adjustment by altering the output impedance of the PDN as measured at the IC die load represented by variable current source 16 (FIGS. 3-6 and 10). The impedance adjustment is preferably achieved by the impedance function of anti-resonance tuning circuit 110 according to various embodiments herein, which has a zero centered at the frequency of the die package resonance, or approximately centered close enough to reduce the resonance peak by a desired amount to achieve a desired specification. Impedance adjustment circuit 110 has the advantage of using much smaller capacitor values for tuning capacitor 113 than capacitors used in prior circuits that merely add decap capacitance. For example, the value of tuning capacitor 113 may be less than ¹⁄₁₀ or ¹⁄₁₀₀ of the value of package decaps 28. The smaller capacitor values not only saves cost and space, but eases the design process by allowing less decap capacitors to be used in many cases. Also, tuning capacitors 113 are not required to be controlled-ESR (equivalent series resistance) capacitors such as those often employed in known anti-resonance designs on a package or circuit board to suppress the resonance. This provides a cost savings. Further, dampening resistor 115 can by physically much smaller (and have a higher resistance value) than resistors used in solutions that place a dampening resistor in series with package decaps, which carry larger currents and require physically larger resistors for dampening. Dampening resistors 115 may also be implemented with on-die resistors, a more reliable process than accounting for ESRs in decap capacitors.

Figure 4:
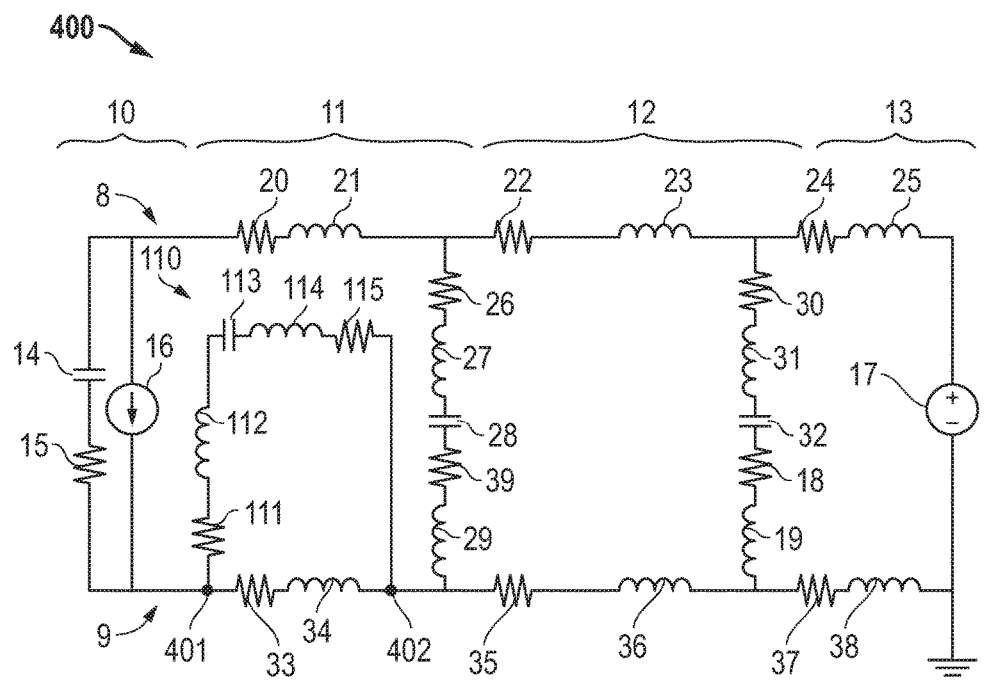
FIG. 4 illustrates in circuit diagram form another power delivery network for a packaged integrated circuit according to some embodiments.

FIG. 4 illustrates in circuit diagram form another PDN 400 for a packaged IC die 10 according to some embodiments. Generally, IC die 10 and package circuitry 11 are constructed similarly to the those described with respect to FIG. 3, with anti-resonance tuning circuit 110 implemented differently. In this version, anti-resonance tuning circuit 110 includes the same series elements discussed above, but includes the connection at first node 401 to negative power supply conductors 9, and at second node 402 directly to a selected carrier substrate negative conductive structure. The connection of first node 401 to tuning capacitor 113 is implemented similarly to that of first node 109 of FIG. 3, providing a parallel, feedback path from negative power supply conductors 9 through anti-resonance tuning circuit 110 to the carrier substrate negative conductive structures. In operation, anti-resonance tuning circuit 110 feeds back current between at least one of the IC package negative conductive structures and the IC die negative power supply conductor 9 at the resonant frequency for the die package resonance.

Figure 5:
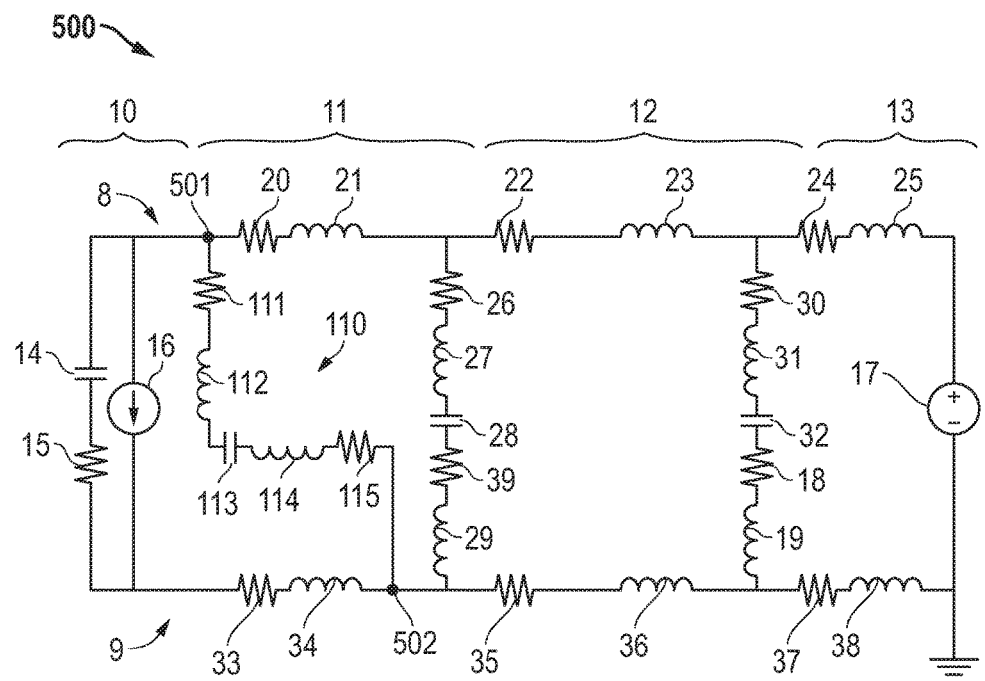
FIG. 5 illustrates in circuit diagram form yet another power delivery network for a packaged integrated circuit according to some embodiments.

FIG. 5 illustrates in circuit diagram form a yet another PDN 500 for a packaged IC die 10 according to some embodiments. IC die 10 and package circuitry 11 are constructed similarly to the those described with respect to FIG. 3, with anti-resonance tuning circuit 110 implemented differently. In this version, anti-resonance tuning circuit 110 includes a first node 501 connected to positive power supply conductors 8, and a second node 502 connected directly to the a selected carrier substrate negative conductive structure. The connection of first node 501 to tuning capacitor 113 is implemented similarly to that of first node 109 in FIG. 3. In operation, anti-resonance tuning circuit 110 feeds back current between at least one of the IC package negative conductive structures and the IC negative power supply conductor 9 at the resonant frequency for the die package resonance.

Figure 6:
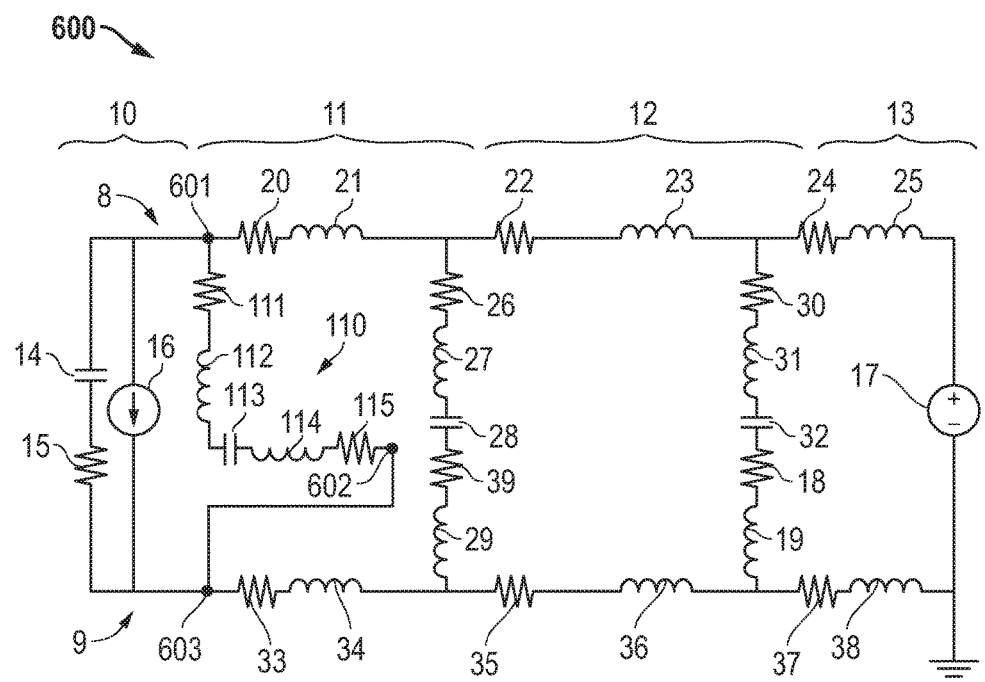
FIG. 6 illustrates in circuit diagram form still another power delivery network for a packaged integrated circuit according to some embodiments.

FIG. 6 illustrates in circuit diagram form still another PDN 600 for a packaged IC die 10 according to some embodiments. The previously-developed circuit representation for the PDN still applies, with a different design for anti-resonance tuning circuit 110. PDN 600 includes anti-resonance tuning circuit 110 as an impedance adjustment circuit having a first node 601 connected to one of an IC die positive power supply conductor 8, and a second node 602 connected directly to a selected conductive structure in package circuitry 11 on the carrier substrate. Anti-resonance tuning circuit 110 includes a series circuit including tuning capacitor 113, tuning inductor 114, and dampening resistor 115, and having an impedance function including a zero at a frequency of the die package resonance characteristic, the impedance function sufficient to reduce the die package resonance enough to prevent die package resonance from exceeding a designated specification. Resistor 111 and inductor 112 represent the resistance and inductance of the conductive structure which connects first node 601 to package circuitry 11. Preferably this connection is implemented with a single IC terminal (such as solder bumps or balls 41 of FIG. 1) and dedicated traces and package vias on the carrier substrate. Anti-resonance tuning circuit 110 includes a third node 603 connected to the IC die 10 negative power supply conductor 9, the third node 603 connected directly to second node 602 on the carrier substrate. In operation, it can be understood that anti-resonance tuning circuit 110 feeds back current at the resonant frequency from the IC die positive power supply conductor 8 through IC package conductive structures connected at first node 601, through the tuning capacitor 113, tuning inductor 114, and dampening resistor 115 to second node 602, and then out of the package to the IC negative power supply conductor 9.

Figure 8:
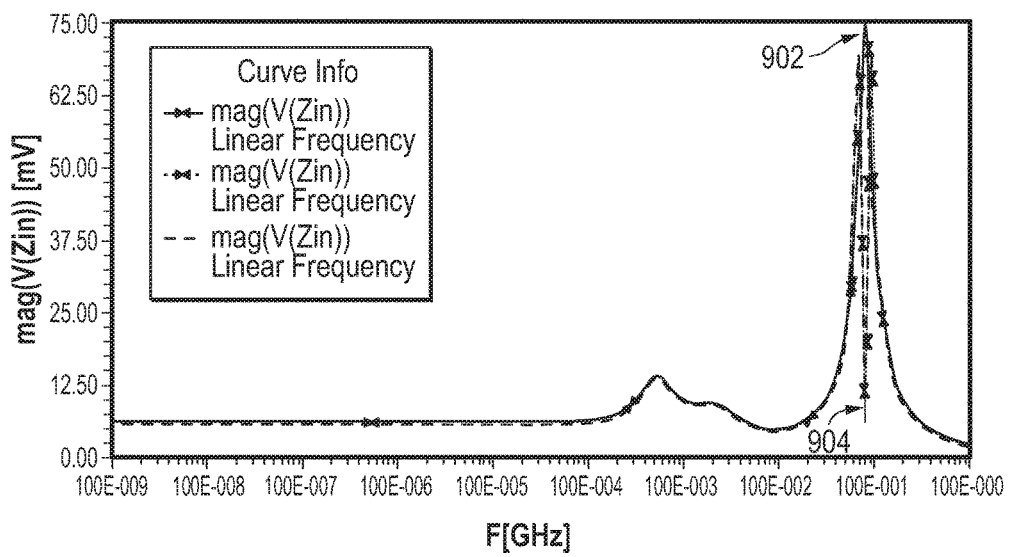
FIG. 8 illustrates in graph form a comparison of impedance performance of power delivery networks according to some embodiments.
Figure 9:
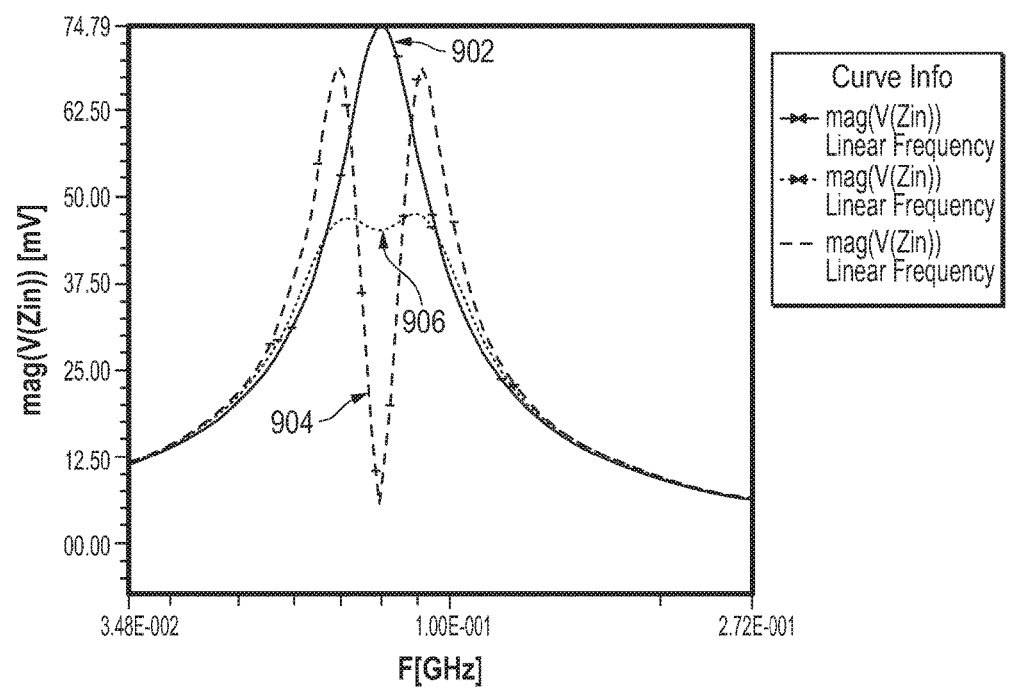
FIG. 9 illustrates in chart form a comparison of impedance performance of power delivery networks according to some embodiments.

FIG. 8 illustrates in chart form a comparison of impedance performance of power delivery networks according to some embodiments. FIG. 9 shows an enlarged portion of the same chart around the resonant frequency of the die package resonance. The charts show the output impedance (the impedance magnitude) of the PDN measured at the IC die 10 over a frequency range up to 270 MHz. Curve 902 shows the output impedance of a PDN with no anti-resonance tuning circuit, like that of FIG. 1. The die package resonance can be seen with a peak at slightly under 1 GHz. Curve 904 shows the output impedance of the PDN of FIG. 3, but without the dampening resistor 115 present in the anti-resonance tuning circuit. The effect of such an anti-resonance tuning circuit 110 can be seen to provide a zero or valley centered at the resonance frequency, while creating two smaller resonant peaks above and below the resonant frequency. In some applications, such a reduction of peak values may be sufficient to avoid the deleterious effect of the die package resonance without using a dampening resistor 115 and meet a designated specification for maximum PDN output impedance. Such a specification may also be provided as a maximum output voltage ripple, a maximum output voltage drop, or another suitable measurement that may be used to track the mitigation of die package resonance. A dampening resistor 115 may be employed to provide further advantages and help meet a designated specification, as can be seen by curve 906, which shows the output impedance of the PDN of FIG. 3 including the dampening resistor 115. The effect of dampening resistor 115 is to dampen the additional peaks created by anti-resonance tuning circuit 110, and generally create a much lower peak impedance with a smoother variation over frequency. The PDN circuits of FIGS. 4-6 and 11 also provide a comparable performance to the depicted performance for the PDN of FIG. 3, with similar advantages. It is noted that the particular resonant frequency of die package resonance will vary across different ICs and applications, and the values of tuning capacitor 113, tuning inductor 114, and dampening resistor 115 may be adjusted at the design phase to achieve the desired tuning of anti-resonance tuning circuit 110.

Figure 10:
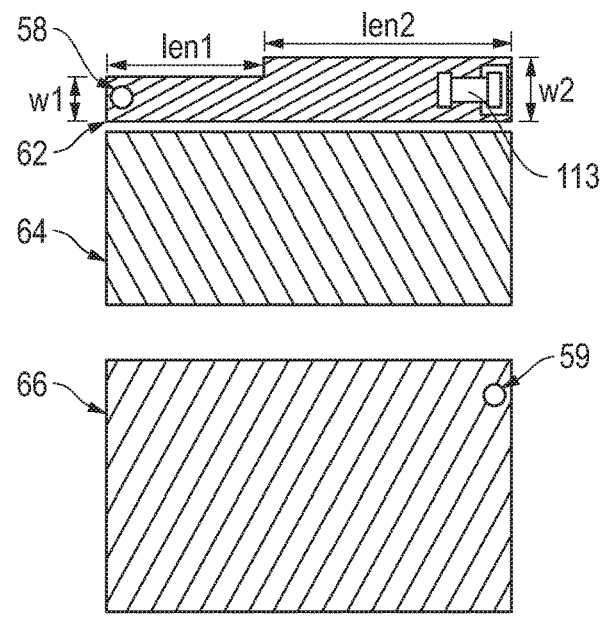
FIG. 10 illustrates in diagram form a topographical view of metal layer structures on a carrier substrate according to some embodiments.

FIG. 10 illustrates in diagram form metal layer structures on a carrier substrate according to some embodiments. The depicted conductive structures 62, 64, and 66 are formed in layers of the packages carrier substrate such as carrier substrate 50 of FIG. 1, and are used in implementing portions of the anti-resonance tuning circuit that reside on the carrier substrate. Conductive structure 66 is a VSS power plane or negative power supply plane in the carrier substrate, formed by filling a desired area of a carrier metal layer with metal or a suitable conductor. Conductive structure 64 is a VDD power plane or positive power supply plane also formed in a carrier substrate metal layer, typically a different layer from the VSS power plane. Conductive structure 62 is a conductive trace of controlled dimensions formed on one of the carrier substrate metal layers. In the depicted version, conductive structure 62 is formed on the same layer as conductive structure 64, however in other versions the structures may be on separate layers, including inner metalized layers or surface metal layer of the carrier substrate. Conductive structure 62 is designed to produce an ESR and ESL having a desired resistance and inductance to implement the tuning inductor 114 and dampening resistor 115. As such, the tuning inductor 114 and dampening resistor 115 in this embodiment are combined into a single element. A package via 58 connects conductive structure 62 to a first node of anti-resonance tuning circuit 110. The length and width of conductive structure 62 are specified in two different regions, designated by w1 and len1, and w2 and len2. These dimensions are controlled in the design to provide that the equivalent resistance and inductance of the trace structure used equal the desired values. This design has the advantages of minimizing the discrete circuit elements needed to form anti-resonance tuning circuit 110, and further achieving the desired conductive coupling of the tuning capacitor physically close to the package's conductive structures carrying the supply voltage. While in this embodiment two different rectangular regions are used to achieve the desired ESR and ESL, other shapes may be used or a single rectangular region may be used. For example, a spiral-shaped trace may be employed to provide a higher ESL value in a given area of metal layer.

Tuning capacitor 113 is connected to conductive structure 62 on one terminal. The other terminal is connected to package via 59, implementing the connection of to the second node of anti-resonance tuning circuit 110 for the embodiments of FIG. 4 and FIG. 5, in which the second node is connected to the carrier substrate negative conductive structures. A gap in conductive structure 62 surrounds package via 59 to allow connection to capacitor 113. It should be noted that this design changes the series order of tuning capacitor 113, tuning inductor 114 and dampening resistor 115, placing tuning capacitor 113 adjacent to the second node. Such a change does not have significant effect to the overall operation of anti-resonance tuning circuit 110. Tuning capacitor 113 may be implemented as one or more multilayered ceramic chip capacitors (MLCCs), with multiple-capacitor implementations including the MLCCs connected in parallel. In embodiments where the second node is connected to the carrier substrate positive conductive structures (for example, FIG. 3), a similar via arrangement may be used connecting to conductive structure 64, or a trace, or combination of traces and vias, may implement the connection of the second node (116, 402, 502) to the carrier substrate positive conductive structures.

Design and construction of anti-resonance tuning circuit 110 for various embodiments herein may proceed according to an example process as follows. A PDN model circuit is produced reflecting equivalent values for the various parts the PDN, like that of FIG. 2. Care should be taken to include the equivalent parasitic inductance of the decoupling capacitors in the model (inductor 29 in FIG. 2), adding that value to the ESL of the package conductors (represented by indictor 21). The resonance frequency of the PDN is estimated based on circuit analysis or simulation. From this, a tuning capacitance value may be selected for tuning capacitor 113, considering available package resources for implementing the tuning inductor 114. While many different capacitance values may achieve the desired resonance (when combined with a suitable inductor), typically a lower value is preferred to a higher value. The lower range of capacitance values is limited by the ESR of the particular capacitors employed, determined at the resonant frequency. Selection of the tuning capacitor 113 and tuning inductor 114 values may be iterative to achieve desired usage of package resources. The value of dampening resistor 115 may be determined by simulation, with the value adjusted so that it reduces the impedance peaks at and around the resonant frequency to a desired value. When MLCC capacitors are used, positioned on the carrier substrate as shown, multiple MLCCs in parallel may be required to lower the total ESR so the design is feasible. (Similar considerations are taken into account for designs that employ on-die capacitors.) For example, one example design to mitigate package resonance at 70 MHz includes three package-mounted 10 nF MLCC capacitors to implement tuning capacitor 113, with tuning inductor 114 having a value of 90 pH and dampening resistor 115 having a value of 80 mOhms. Once MLCC value(s) are selected, the ESR and ESL of conductive structure 62 are implemented to tune the circuit to lower the impedance peak, with the dimensions of conductive structure 62 determined therefrom. Placement of the conductive path from the IC die power supply conductors (8 or 9) to package via 58 is flexible, as is placement of equivalent conductive paths for other circuit configurations such as those in which conductive structure 62 is formed in the carrier substrate's surface metal layer. Preferably the connection to the IC die power supply conductors (8 or 9) on the IC die 10 is modeled to make sure it is a low impedance connection.

Figure 11:
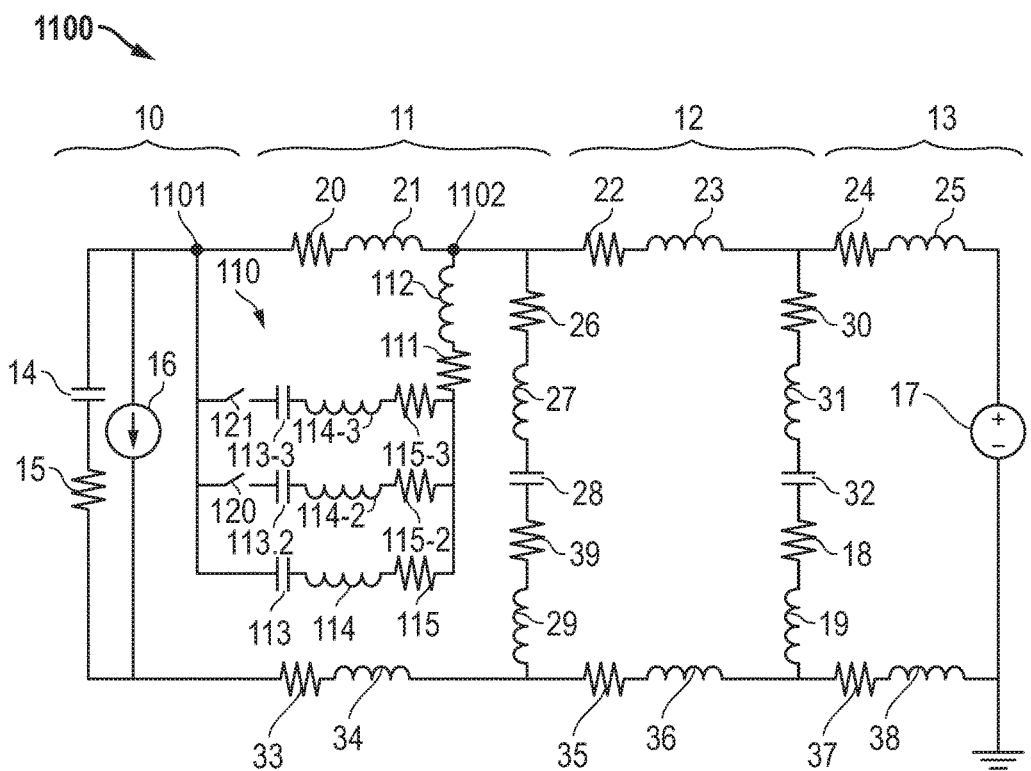
FIG. 11 illustrates in circuit diagram form another power delivery network for a packaged integrated circuit according to some embodiments.

FIG. 11 illustrates in circuit diagram form another PDN for a packaged integrated circuit according to some embodiments. The previously-developed circuit representation for the PDN 1100 is again shown, with a different design for anti-resonance tuning circuit 110 connected between first node 1101 and second node 1102. In this version, tuning capacitor 113 is implemented as an on-die capacitor. Anti-resonance tuning circuit 110 further comprises one or more additional sub-circuits connected between first node 1101 and second node 1102. Depicted is a first additional sub-circuit including a switch 120 connected to first node 1101, and a tuning capacitor 113-2, a tuning inductor 114-2, and a dampening resistor 115-2 connected in series with switch 120. Another branch is shown including switch 121 connected to first node 1101, and elements 113-3, 114-3, and 115-3. The additional branches are connected to second node 1102 through the resistance 111 and inductance 112 representing the package conductive structure implementing the connection from the die to the package circuitry 11. In operation, switches 120 and 121 allow the anti-resonance tuning circuit 110 to be further tuned after construction, by enabling each switch to connect the respective branch into the circuit to alter the total capacitance and inductance of the circuit. Opening switch 120 or 121 removes the respective branch from the circuit. A plurality of such additional branches may be employed to allow precision tuning of anti-resonance tuning circuit 110. The element values in each branch may be identical or may vary, such as, for example, by providing successively smaller values in the additional branches allowing fine tuning. Tuning inductors 114, 114-2, and 114-3 may be formed on the IC die. Dampening resistors 115, 115-2, and 115-3 may also be formed on the IC die. Further, while dampening resistors 115-2 and 115-3 are shown in each of the additional branches, a dampening resistor may be provided in series with the entire circuit instead, such as adjacent to resistance 111 or adjacent to first node 1101. This embodiment provides a further advantage of allowing for adjustment based on process variations that may affect the die package resonance or the anti-resonance tuning circuit itself. Using a plurality of switchable branches allows adjusting for such variations while maintaining the advantages of using an impedance adjustment circuit over the prior solutions. The adjustability also has the advantage of allowing the packaged IC to be placed in a variety of conditions, such as in multi-chip modules, where external conditions such as neighboring decap capacitors may affect the die-package resonance frequency.

Any of the power delivery networks described above or any portions thereof such as anti-resonance tuning circuit 110 of FIG. 3 may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates from a synthesis library. The netlist includes a set of gates that also represent the functionality of the hardware including integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, the techniques herein may be employed with PDNs on multi-chip modules and other package arrangements that do not simply include a single die on a package carrier. In a stacked memory module, for example, an anti-resonance tuning circuit on an upper stacked die may include a conductive structure passing through or passing by lower dies to a carrier substrate to achieve the second node conductive coupling of various embodiments herein. The description herein should be interpreted as supporting claims to the various described features in any functioning sub-combination. For example, an anti-resonance tuning circuit may include on-chip tuning capacitor may be combined in series with resistor and inductor on a package carrier substrate. It should be noted that the series order of elements in anti-resonance tuning circuit 110 may be altered in any order without significantly effecting the operation, allowing any of the elements may be included on the IC die or on a carrier. Further, any of the series elements of anti-resonance circuit 110 may be included in an alternate structure in a package or multi-chip module, such as, for example, a daughter carrier substrate, or a substrate vertically spanning multiple IC dies. Conductive structures of a mounting socket may also be included in the model without changing the overall techniques herein.

Accordingly, it is intended by the appended claims to cover all modifications of the disclosed embodiments that fall within the scope of the disclosed embodiments.

What is claimed is:

1. An integrated circuit structure comprising:
   an integrated circuit (IC) die including positive and negative power supply conductors;
   a package including a carrier substrate carrying the IC die, and positive and negative external power supply contacts coupled to the IC die positive and negative power supply conductors through respective positive and negative conductive structures of the carrier substrate, each of the conductive structures having an equivalent series inductance (ESL);
   one or more decoupling capacitors coupled between the positive and negative power supply conductors, the one or more decoupling capacitors and the ESLs of carrier substrate positive and negative conductive structures together exhibiting a die package resonance characteristic; and
   an anti-resonance tuning circuit having a first node coupled to one of the IC die positive or negative power supply conductors and a second node conductively coupled directly to one of the carrier substrate positive or negative conductive structures, the anti-resonance tuning circuit comprising a tuning capacitor, a tuning inductor, and a dampening resistor coupled in series and having values sufficient to reduce the die package resonance characteristic enough to prevent die package resonance characteristic from exceeding a designated specification.

2. The integrated circuit structure of claim 1, in which the first node is conductively coupled to the IC die positive power supply conductor, and the second node is conductively coupled the carrier substrate negative conductive structure.

3. The integrated circuit structure of claim 1, in which the first node is conductively coupled to the IC die negative power supply conductor, and the second node is conductively coupled to the carrier substrate positive conductive structure.

4. The integrated circuit structure of claim 1, in which the first node is conductively coupled to the IC die positive power supply conductor, and the second node is conductively coupled to the carrier substrate positive conductive structure.

5. The integrated circuit structure of claim 1, in which the tuning capacitor is a ceramic chip capacitor mounted on the carrier substrate.

6. The integrated circuit structure of claim 1, in which the tuning inductor and the dampening resistor are formed using an equivalent series resistance (ESR) and ESL of a conductive trace formed on the carrier substrate having a specified width and length to achieve desired resistance and inductance values.

7. The integrated circuit structure of claim 1, in which the tuning capacitor is formed on the IC die.

8. The integrated circuit structure of claim 1, in which the tuning inductor is formed on the IC die.

9. The integrated circuit structure of claim 1, in which the tuning capacitor and the tuning inductor are formed on the IC die.

10. The integrated circuit structure of claim 1, in which the anti-resonance tuning circuit further comprises an additional sub-circuit coupled between the first and second nodes and comprising one of a capacitor and an inductor in series with a switch.

11. A circuit for reducing die package resonance of an integrated circuit (IC) die having one or more decoupling capacitors coupled between positive and negative power supply conductors, the one or more decoupling capacitors and equivalent series inductances (ESLs) of power conductors within a carrier substrate holding the IC die together exhibiting a die package resonance characteristic, the circuit comprising:
   an impedance adjustment circuit having a first node conductively coupled to one of an IC die positive or negative power supply conductors and a second node conductively coupled directly to a selected conductive structure on the carrier substrate, the impedance adjustment circuit comprising a series circuit having an impedance function including a zero with a center frequency approximately equal to the frequency of the die package resonance characteristic.

12. The circuit of claim 11, in which the impedance adjustment circuit further comprises a third node conductively coupled to the IC die negative power supply conductor, the third node conductively coupled directly to the second node on the carrier substrate.

13. The circuit of claim 11, in which the impedance adjustment circuit comprises a tuning capacitor, and a tuning inductor, and a dampening resistor connected in series between the first and second nodes.

14. The circuit of claim 13, in which the tuning capacitor is a ceramic chip capacitor mounted on the carrier substrate.

15. The circuit of claim 13, in which the tuning inductor and the dampening resistor are formed using an equivalent series resistance (ESR) and ESL of a conductive trace formed on the carrier substrate having a specified width and length to achieve desired resistance and inductance values.

16. The circuit of claim 11, in which the first node is conductively coupled to the IC die positive power supply conductor, and the second node is conductively coupled to a positive one of the carrier substrate power conductors.

17. A method of mitigating die package resonance in a packaged IC power distribution system, the method comprising:

supplying power to digital circuitry on the packaged IC with positive and negative power supply conductors on the packaged IC supplied through positive and negative conductive structures in an IC package;

operating the digital circuitry;

mitigating power supply deviations to the digital circuitry with one or more decoupling capacitors; and feeding back current through a circuit branch connected between at least one of the IC package positive or negative conductive structures and at least one of the IC positive or negative power supply conductors at a resonant frequency.

18. The method of claim 17, in which feeding back current is done through a circuit branch having impedance function including a zero at a frequency of the die package resonance.

19. The method of claim 17, in which feeding back current further comprises feeding the current though a dampening resistor.

20. The method of claim 17, in which feeding back current further comprises feeding the current through a tuning capacitor in the IC package.

* * * * *

UNITED STATES PATENT AND TRADEMARK OFFICE
CERTIFICATE OF CORRECTION

PATENT NO. : 10,355,661 B1  
APPLICATION NO. : 16/115301  
DATED : July 16, 2019  
INVENTOR(S) : Fei Guo It is certified that error appears in the above-identified patent and that said Letters Patent is hereby corrected as shown below:

On the Title Page

Item (73), Assignee, please replace "ADVANCED MICRO DEVICES, INC., Santa Clara, CA (US)" with -- ATI Technologies ULC, Markham (CA) --.

Signed and Sealed this  
Ninth Day of June, 2020

Andrei Iancu  
*Director of the United States Patent and Trademark Office*